United States Patent
Oka et al.

(10) Patent No.: US 8,008,972 B2
(45) Date of Patent: Aug. 30, 2011

(54) DIFFERENTIAL SIGNAL GENERATOR CIRCUIT

(75) Inventors: Toshihide Oka, Tokyo (JP); Masaaki Shimada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 967 days.

(21) Appl. No.: 11/934,826

(22) Filed: Nov. 5, 2007

(65) Prior Publication Data

US 2008/0297252 A1 Dec. 4, 2008

(30) Foreign Application Priority Data

May 30, 2007 (JP) ................................ 2007-143778

(51) Int. Cl.
*H03F 3/45* (2006.01)
(52) U.S. Cl. ............................ 330/257; 330/85; 330/253
(58) Field of Classification Search .................. 330/257, 330/85, 253
See application file for complete search history.

(56) References Cited

U.S. PATENT DOCUMENTS

| | | | |
|---|---|---|---|
| 4,922,131 A * | 5/1990 | Anderson et al. ............... | 327/66 |
| 5,030,925 A | 7/1991 | Taylor | |
| 5,687,330 A * | 11/1997 | Gist et al. ...................... | 710/305 |
| 6,137,360 A * | 10/2000 | Memida ........................ | 330/253 |
| 6,885,249 B2 | 4/2005 | Suzunaga | |
| 7,176,753 B2 * | 2/2007 | Noda et al. .................... | 327/543 |
| 7,895,894 B2 * | 3/2011 | Kanai et al. .................... | 73/579 |
| 7,961,484 B2 * | 6/2011 | Lalithambika et al. .... | 363/56.09 |

FOREIGN PATENT DOCUMENTS

| | | |
|---|---|---|
| JP | 60-213108 A | 10/1985 |
| JP | 7-250105 | 9/1995 |
| JP | 10-294622 A | 11/1998 |
| JP | 2004-179982 | 6/2004 |
| JP | 2005-94149 A | 4/2005 |

OTHER PUBLICATIONS

Inphi, "1347TL, 11.3 Gbps TIA/LIA, Data Sheet", p. 2, 5.

* cited by examiner

*Primary Examiner* — Patricia Nguyen
(74) *Attorney, Agent, or Firm* — Leydig, Voit & Mayer, Ltd.

(57) ABSTRACT

A differential signal generator circuit includes: a first amplifier for comparing an input signal with a threshold voltage and outputting differential signals; and a second amplifier for adjusting the threshold voltage in response to the differential signals. The second amplifier includes: a first transistor and a second transistor forming a differential pair, the gate of each transistor receiving a respective one of the differential signals; a third transistor and a fourth transistor forming a current mirror, the third transistor being connected between the drain of the first transistor and a reference potential point, the fourth transistor being connected between the drain of the second transistor and the reference potential point; a current source connected to the sources of the first and second transistors; and an adjusting section for adjusting drain current of the first transistor in response to an externally applied current or voltage. The threshold voltage is adjusted in response to drain voltage of the second transistor.

4 Claims, 3 Drawing Sheets

DIFFERENTIAL SIGNAL GENERATOR CIRCUIT

BACKGROUND OF THE INVENTION

1. Field of the Invention

The present invention relates to differential signal generator circuits in which a first amplifier compares the input signal with a threshold voltage and outputs differential signals and a second amplifier adjusts the threshold voltage in response to the differential signals. More particularly, the invention relates to differential signal generator circuits that allow for easy adjustment of the cross-point of the differential signals.

2. Background Art

In a typical optical signal receiver, etc., the optical signal is converted into an electrical signal by a photodiode preamplifier and then into differential signals by a differential signal generator circuit which are then discriminated by a discriminator circuit. The optical signal is a two-state signal that has a high intensity state (called the "mark" or "mark state") and a low intensity state (called the "space" or "space state"), each representing a different value. It should be noted that generally the optical signal includes greater noise when in the mark state than when in the space state. Therefore, it might happen that noise in the optical signal in the mark state prevents the discriminator circuit from properly discriminating the differential signals. To avoid this, the cross-point of the differential signals input to the discriminator circuit may be adjusted such that the discrimination level is slightly lower than the average value of the input signal. In many cases the appropriate amount of such adjustment of the cross-point is 10 mV or less, although this may vary depending on the performance of the amplifier.

One well known differential signal generator circuit includes a first amplifier for comparing the input signal with a threshold voltage and outputting differential signals and a second amplifier for adjusting the threshold voltage in response to the differential signals (see, e.g., JP-A-7-250105).

FIG. 7 is a block diagram showing a conventional differential signal generator circuit. Referring to FIG. 7, a first amplifier 11 compares the input signal $V_{IN}$ with a threshold voltage $V_{th}$ and outputs differential signals $V_+$ and $V_-$. A second amplifier 12 made up of a differential amplifier receives the differential signals $V_+$ and $V_-$ and outputs an output voltage $V_{out}$. One end of a resistance 13 is connected to the output of the second amplifier 12 to convert the output voltage $V_{out}$ to the threshold voltage $V_{th}$. That is, in response to the differential signals $V_+$ and $V_-$, the second amplifier 12 automatically adjusts the threshold voltage $V_{th}$ to be equal to the average value (or voltage) of the input signal $V_{IN}$. The other end of the resistance 13 is grounded through a capacitance 14. The discriminator circuit (15) is a clock and data recovery (or CDR) circuit, etc., and determines, based on the average values of the differential signals $V_+$ and $V_-$ output from the first amplifier 11, whether the input signal $V_{IN}$ is at a logical high level or a logical low level.

This conventional differential signal generator circuit is designed such that if the optical signal includes significant noise when in its mark state, a voltage may be externally applied through an adjustment terminal ADJUST and a resistance 17 to adjust the threshold voltage $V_{th}$ to be slightly lower than the average value (or voltage) of the input signal $V_{IN}$.

SUMMARY OF THE INVENTION

Thus, conventionally, the cross-point of the differential signals $V_+$ and $V_-$ is adjusted by externally adjusting the threshold voltage $V_{th}$ or the differential signals $V_+$ and $V_-$ directly. Therefore, although the internal circuit has a simple configuration, the external control circuit must be adapted to be able to finely adjust the cross-point of the differential signals, for example, by approximately a few millivolts. That is, it has been difficult to precisely adjust the cross-point of the differential signals. Furthermore, this configuration prevents the use of a small common DA converter, etc., and hence is not practical for most applications.

The present invention has been devised to solve the above problems. It is, therefore, an object of the present invention to provide a differential signal generator circuit that allows for easy adjustment of the cross-point of the differential signals.

According to one aspect of the present invention, a differential signal generator circuit includes: a first amplifier for comparing an input signal with a threshold voltage and outputting differential signals; and a second amplifier for adjusting the threshold voltage in response to the differential signals; wherein the second amplifier includes: a first transistor and a second transistor forming a differential pair, the gate of each transistor receiving a respective one of the differential signals; a third transistor and a fourth transistor forming a current mirror, the third transistor being connected between the drain of the first transistor and a reference potential point, the fourth transistor being connected between the drain of the second transistor and the reference potential point; a current source connected to the sources of the first and second transistors; and an adjusting section for adjusting the drain current of the first transistor in response to an externally applied current or voltage. The threshold voltage is adjusted in response to the drain voltage of the second transistor.

Thus, the present invention provides a differential signal generator circuit that allows for easy adjustment of the cross-point of the differential signals.

Other and further objects, features and advantages of the invention will appear more fully from the following description.

DETAILED DESCRIPTION OF THE PREFERRED EMBODIMENTS

First Embodiment

Figure 1:
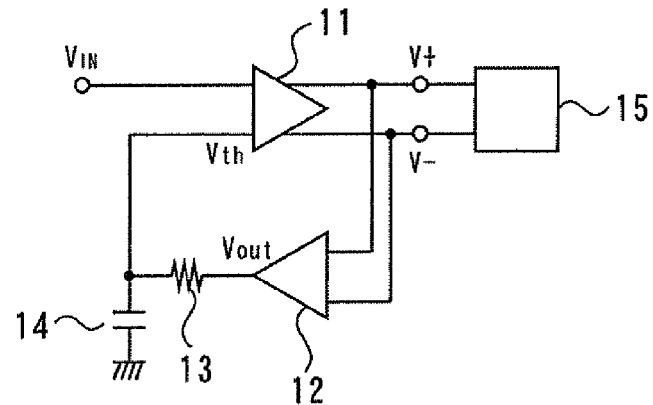
FIG. 1 is a block diagram showing a differential signal generator circuit according to a first embodiment of the present invention.

FIG. 1 is a block diagram showing a differential signal generator circuit according to a first embodiment of the present invention. Referring to FIG. 1, a first amplifier 11 compares the input signal $V_{IN}$ with a threshold voltage $V_{th}$ and outputs differential signals $V_+$ and $V_-$. A second amplifier 12 receives the differential signals $V_+$ and $V_-$ and outputs an output voltage $V_{out}$. One end of a resistance 13 is connected to the output of the second amplifier 12 to convert the output voltage $V_{out}$ to the threshold voltage $V_{th}$. That is, the second amplifier 12 adjusts the threshold voltage $V_{th}$ in response to the differential signals $V_+$ and $V_-$. The other end of the resistance 13 is grounded through a capacitance 14. The discriminator circuit (15) is a clock and data recovery (or CDR) circuit, etc., and determines, based on the average values of the differential signals $V_+$ and $V_-$ output from the first amplifier 11, whether the input signal $V_{IN}$ is at a logical high level or a logical low level.

Figure 2:
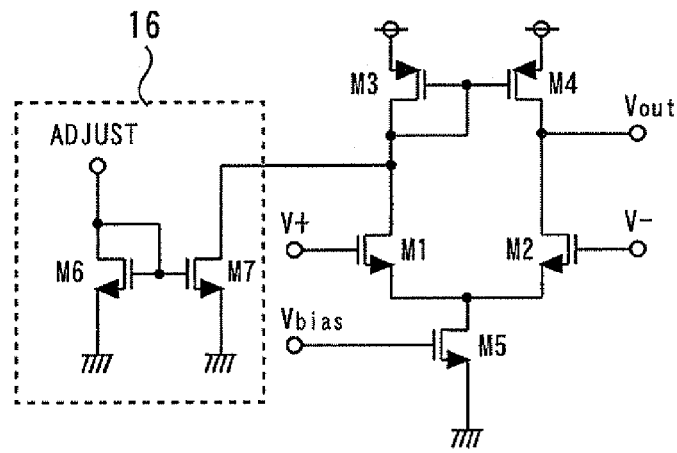
FIG. 2 is a circuit diagram of the second amplifier of the present embodiment.

FIG. 2 is a circuit diagram of the second amplifier of the present embodiment. As shown, the second amplifier is a differential input, single-ended output amplifier. Referring to FIG. 2, NMOS transistors M1 and M2 (referred to as a "first transistor" and a "second transistor," respectively, in the appended claims) form a differential pair. The differential signals $V_+$ and $V_-$ are applied to the gates of the NMOS transistors M1 and M2, respectively.

Referring still to FIG. 2, PMOS transistors M3 and M4 (referred to as a "third transistor" and a "fourth transistor," respectively, in the appended claims) form a current mirror. The PMOS transistor M3 is connected between the drain of the NMOS transistor M1 and a voltage source (or reference potential point), and the PMOS transistor M4 is connected between the drain of the NMOS transistor M2 and the voltage source. The sources of the NMOS transistors M1 and M2 are connected together at a node, and an NMOS transistor M5 is connected between this node and ground potential. A predetermined voltage $V_{bias}$ is applied to the gate of the NMOS transistor M5 so that the NMOS transistor M5 functions as a current source. The drain voltage of the NMOS transistor M2 is output as the output voltage $V_{out}$. That is, the second amplifier 12 adjusts the threshold voltage $V_{th}$ by applying the drain voltage of its NMOS transistor M2.

Further, the gate and drain of an NMOS transistor M6 are connected to an adjustment terminal ADJUST, and its source is grounded. The drain of an NMOS transistor M7 is connected to the drain of the NMOS transistor M1, and the source of the NMOS transistor M7 is grounded. The NMOS transistors M6 and M7 constitute an adjusting section 16 which adjusts the drain current of the NMOS transistor M1 in response to the current externally applied to the adjustment terminal ADJUST.

When no current is externally applied to the adjustment terminal ADJUST, the adjusting section 16 does not make any adjustment or changes to the drain current of the NMOS transistor M1. Therefore, the current flowing through the NMOS transistor M1 and the PMOS transistor M3 is equal to that flowing through the NMOS transistor M2 and the PMOS transistor M4. As a result, the output voltage $V_{out}$ is set such that the average values of the differential signals $V_+$ and $V_-$ are equal.

On the other hand, when a current is externally applied to the adjustment terminal ADJUST, a portion of the current flowing through the NMOS transistor M3 flows through the NMOS transistor M7 instead of through the NMOS transistor M1. That is, the adjustment section 16 draws a portion of the current that flows through the NMOS transistor M3, allowing only the remaining portion of the current to flow in the NMOS transistor M1 as its drain current. This means that a disparity occurs between the currents flowing through the NMOS transistors M1 and M2, causing a change in the output voltage $V_{out}$. This results in a difference between (the average values of) the differential signals $V_+$ and $V_-$, that is, results in displacement of the cross-point of the differential signals $V_+$ and $V_-$.

As described above, the adjusting section 16 allows for easy adjustment of the cross-point of the differential signals $V_+$ and $V_-$. Furthermore, since the NMOS transistors M6 and M7 in the adjusting section 16 form a current mirror, the adjusting section 16 can be set such that applying a large current to the adjustment terminal ADJUST results in only a small change in the drain current of the NMOS transistor M1. This means that, for example, the current or voltage externally applied to the adjusting section 16 is changed by as much as a few milliamperes or a few hundreds of millivolts when finely adjusting the output voltage $V_{out}$ of the second amplifier 12, e.g., by a few millivolts. Therefore, the cross-point of the differential signals $V_+$ and $V_-$ can be finely adjusted externally using a common chipset.

It should be noted that the adjusting section 16 may be adapted to adjust the drain current of the NMOS transistor M1 in response to the voltage, not current, externally applied to the adjustment terminal ADJUST, with the same effect. That is, the present embodiment can be applied to the "voltage-forcing current-monitoring" mode, as well as the "current-forcing voltage-monitoring" mode.

Second Embodiment

Figure 3:
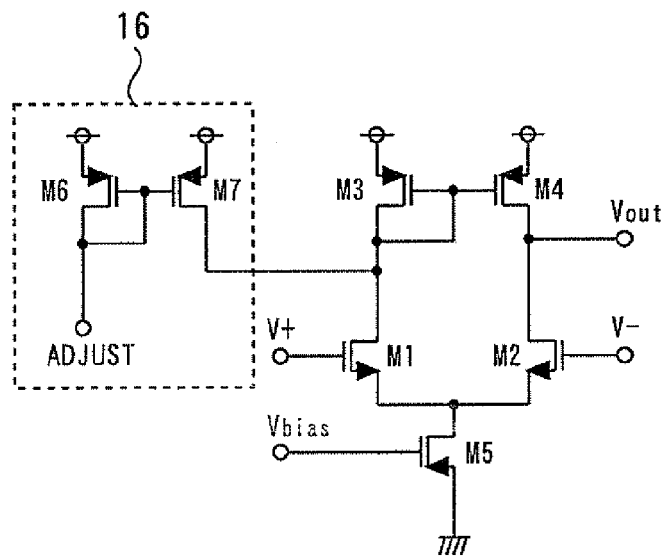
FIG. 3 is a circuit diagram of a second amplifier according to a second embodiment of the present invention.

FIG. 3 is a circuit diagram of a second amplifier according to a second embodiment of the present invention. This second amplifier differs from that of the first embodiment in that the adjusting section 16 has a different configuration.

Referring to FIG. 3, the gate and drain of a PMOS transistor M6 are connected to an adjustment terminal ADJUST, and its source is connected to a voltage source. The drain of a PMOS transistor M7 is connected to the drain of the NMOS transistor M1, and the source of the PMOS transistor M7 is connected to the voltage source.

When a current or a voltage is externally applied to the adjustment terminal ADJUST, a current flows from the PMOS transistor 7 into the NMOS transistor M1. Thus, the adjusting section 16 adjusts the drain current of the NMOS transistor M1 in response to the current or voltage externally applied to the adjustment terminal ADJUST. This allows for easy adjustment of the cross-point of the differential signals, as in the first embodiment.

Third Embodiment

Figure 4:
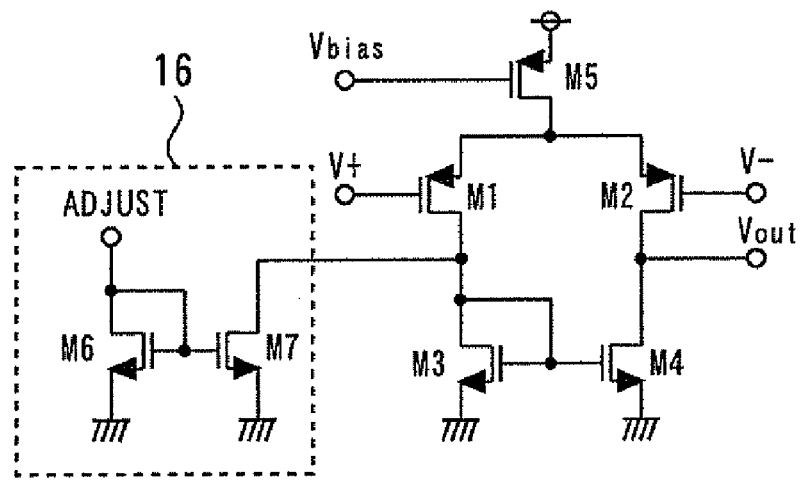
FIG. 4 is a circuit diagram of a second amplifier according to a third embodiment of the present invention.

FIG. 4 is a circuit diagram of a second amplifier according to a third embodiment of the present invention. As shown, this second amplifier is a differential input, single-ended output amplifier. Referring to FIG. 4, PMOS transistors M1 and M2 (referred to as a "first transistor" and a "second transistor," respectively, in the appended claims) form a differential pair. Differential signals $V_+$ and $V_-$ are applied to the gates of the PMOS transistors M1 and M2, respectively.

Referring still to FIG. 4, NMOS transistors M3 and M4 (referred to as a "third transistor" and a "fourth transistor," respectively, in the appended claims) form a current mirror. The NMOS transistor M3 is connected between the drain of the PMOS transistor M1 and ground potential (or reference potential point), and the NMOS transistor M4 is connected between the drain of the PMOS transistor M2 and ground potential. The sources of the PMOS transistors M1 and M2 are connected together at a node, and a PMOS transistor M5 is connected between this node and a voltage source. A predetermined voltage $V_{bias}$ is applied to the gate of the PMOS transistor M5 so that the PMOS transistor MS functions as a current source. The drain voltage of the PMOS transistor M2 is output as the output voltage $V_{out}$. That is, the second amplifier 12 adjusts the threshold voltage $V_{th}$ by applying the drain voltage of its PMOS transistor M2.

Further, the gate and drain of an NMOS transistor M6 are connected to an adjustment terminal ADJUST, and its source is grounded. The drain of an NMOS transistor M7 is connected to the drain of the PMOS transistor M1, and the source of the NMOS transistor M7 is grounded. The NMOS transistors M6 and M7 constitute an adjusting section 16 which adjusts the drain current of the PMOS transistor M1 in response to the current or voltage externally applied to the adjustment terminal ADJUST.

Thus, the second amplifier 12 of the present embodiment employs PMOS transistors (M1, M2) as input transistors and NMOS transistors (M3, M4) as load transistors and provides the same effect as described in connection with the first embodiment.

Fourth Embodiment

The second amplifiers of the first to third embodiments are feedback differential-to-single-ended converter circuits which automatically adjust the offset of the first amplifier. A second amplifier of a fourth embodiment of the present invention, on the other hand, is a feedforward differential converter circuit functioning as a unity gain buffer for the first amplifier and does not provide automatic offset adjustment.

Figure 5:
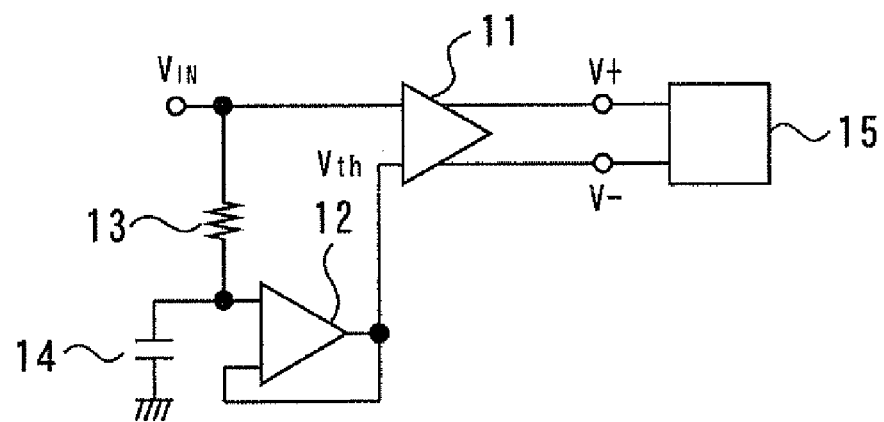
FIG. 5 is a block diagram showing a differential signal generator circuit of the present embodiment.

FIG. 5 is a block diagram showing a differential signal generator circuit of the present embodiment. Referring to FIG. 5, a first amplifier 11 compares the input signal $V_{IN}$ with a threshold voltage $V_{th}$ and outputs differential signals $V_+$ and $V_-$. A second amplifier 12 receives the input signal $V_{IN}$ through a resistance 13 and also receives its own output signal as feedback, and outputs the threshold voltage $V_{th}$. That is, the second amplifier 12 adjusts the threshold voltage $V_{th}$ in response to the input signal $V_{IN}$. One end of the resistance 13 is grounded through a capacitance 14. The discriminator circuit (15) is a clock and data recovery (or CDR) circuit, etc., and determines, based on the average values of the differential signals $V_+$ and $V_-$ output from the first amplifier 11, whether the input signal $V_{IN}$ is at a logical high level or a logical low level.

Figure 6:
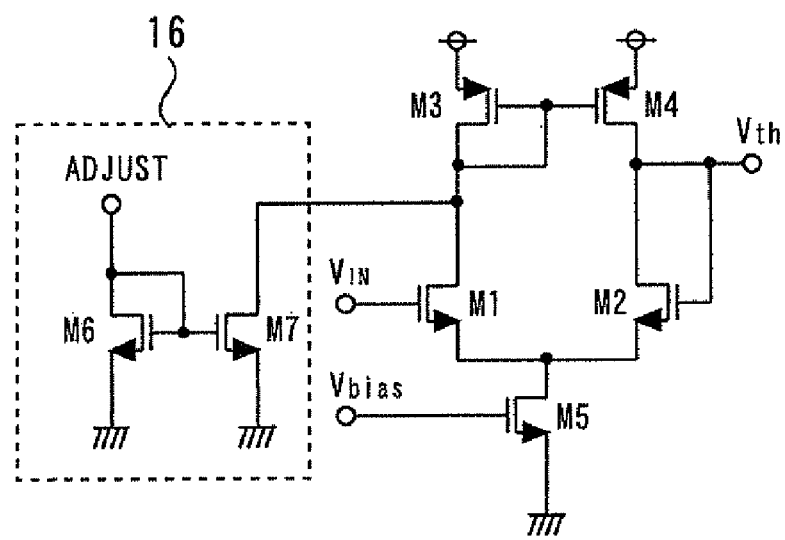
FIG. 6 is a circuit diagram of the second amplifier 12 of the present embodiment.
Figure 7:
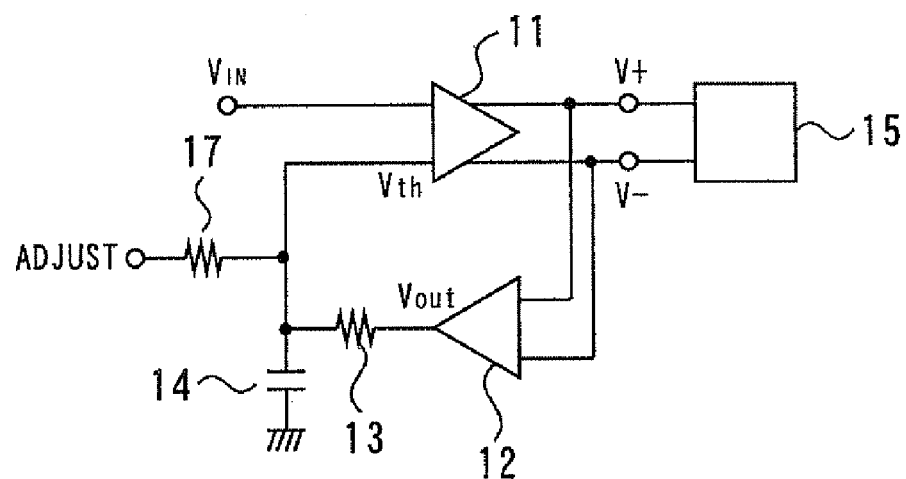
FIG. 7 is a block diagram showing a conventional differential signal generator circuit.

FIG. 6 is a circuit diagram of the second amplifier 12 of the present embodiment. As shown, the second amplifier is a differential input, single-ended output amplifier. Referring to FIG. 6, NMOS transistors M1 and M2 (referred to as a "first transistor" and a "second transistor," respectively, in the appended claims) form a differential pair. The input signal $V_{IN}$ is input to the gate of the NMOS transistor M1. The drain and gate of the NMOS transistor M2 are connected together.

Referring still to FIG. 6, PMOS transistors M3 and M4 (referred to as a "third transistor" and a "fourth transistor," respectively, in the appended claims) form a current mirror. The PMOS transistor M3 is connected between the drain of the NMOS transistor M1 and a voltage source (or reference potential point), and the PMOS transistor M4 is connected between the drain of the NMOS transistor M2 and the voltage source. The sources of the NMOS transistors M1 and M2 are connected together at a node, and an NMOS transistor M5 is connected between this node and ground potential. A predetermined voltage $V_{bias}$ is applied to the gate of the NMOS transistor M5 so that the NMOS transistor M5 functions as a current source. The drain voltage of the NMOS transistor M2 is output as the threshold voltage $V_{th}$. That is, the second amplifier 12 adjusts the threshold voltage $V_{th}$ by applying the drain voltage of its NMOS transistor M2.

Further, the gate and drain of an NMOS transistor M6 are connected to an adjustment terminal ADJUST, and its source is grounded. The drain of an NMOS transistor M7 is connected to the drain of the NMOS transistor M1, and the source of the NMOS transistor M7 is grounded. The NMOS transistors M6 and M7 constitute an adjusting section 16 which adjusts the drain current of the NMOS transistor M1 in response to the current or voltage externally applied to the adjustment terminal ADJUST. This allows for easy adjustment of the cross-point of the differential signals, as in the first embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-143778, filed on May 30, 2007 including specification, claims, drawings and summary, on which the Convention priority of the present application is based, are incorporated herein by reference in its entirety.

What is claimed is:

1. A differential signal generator circuit comprising:
  a first amplifier for comparing an input signal with a threshold voltage and outputting differential signals; and
  a second amplifier for adjusting the threshold voltage in response to the differential signals, wherein said second amplifier includes
    a first transistor and a second transistor forming a differential pair, each of the first and second transistors having a source, a drain, and a gate, the gates receiving respective ones of the differential signals,
    a third transistor and a fourth transistor forming a first current mirror, said third transistor being connected between the drain of said first transistor and a reference potential point, said fourth transistor being connected between the drain of said second transistor and said reference potential point,
    a current source connected to the sources of said first and second transistors, and
    an adjusting section for adjusting drain current of said first transistor in response to an externally applied current or voltage, whereby the threshold voltage is adjusted in response to drain voltage of said second transistor.

2. A differential signal generator circuit comprising:
  a first amplifier for comparing an input signal with a threshold voltage and outputting differential signals; and
  a second amplifier for adjusting the threshold voltage in response to the input signal, wherein said second amplifier includes
    a first transistor and a second transistor forming a differential pair, each of said first and second transistors including a source, a drain, and a gate, the gate of said first transistor receiving the input signal, the drain and the gate of said second transistor being connected together,
    a third transistor and a fourth transistor forming a first current mirror, said third transistor being connected between the drain of said first transistor and a reference potential point, said fourth transistor being connected between the drain of said second transistor and said reference potential point,
    a current source connected to the sources of said first and second transistors, and
    an adjusting section for adjusting drain current of said first transistor in response to an externally applied current or voltage, whereby the threshold voltage is adjusted in response to drain voltage of said second transistor.

3. The differential signal generator circuit as claimed in claim 1, wherein said adjusting section is a second current mirror.

4. The differential signal generator circuit as claimed in claim 2, wherein said adjusting section is a second current mirror.

* * * * *